(12) United States Patent
Lin

(10) Patent No.: US 8,766,713 B2
(45) Date of Patent: Jul. 1, 2014

(54) SWITCHING AMPLIFIER WITH EMBEDDED HARMONIC REJECTION FILTER

(75) Inventor: Saihua Lin, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 79 days.

(21) Appl. No.: 13/485,554

(22) Filed: May 31, 2012

(65) Prior Publication Data

US 2013/0321079 A1    Dec. 5, 2013

(51) Int. Cl.
*H03F 3/38*  (2006.01)
*H03K 7/08*  (2006.01)

(52) U.S. Cl.
CPC ........................................ *H03F 3/38* (2013.01)
USPC ............................................. 330/10; 375/238

(58) Field of Classification Search
CPC ......................................................... H03F 3/38
USPC ........................................ 330/10, 124 R, 295
See application file for complete search history.

(56) References Cited

U.S. PATENT DOCUMENTS

| | | | |
|---|---|---|---|
| 4,164,714 | A | 8/1979 | Swanson |
| 7,362,182 | B2 | 4/2008 | Barabash et al. |
| 7,423,464 | B2 | 9/2008 | Scheytt |
| 7,489,189 | B2 | 2/2009 | Lee |
| 7,834,686 | B2 | 11/2010 | Staszewski et al. |
| 8,022,756 | B2 | 9/2011 | Walker et al. |
| 2005/0265481 | A1 | 12/2005 | Bellaouar et al. |
| 2011/0102224 | A1 | 5/2011 | Cathelin et al. |
| 2012/0056676 | A1* | 3/2012 | Frambach ..................... 330/295 |

FOREIGN PATENT DOCUMENTS

WO    0033448 A2    6/2000

OTHER PUBLICATIONS

International Search Report and Written Opinion—PCT/US2013/042750—ISA/EPO—Nov. 7, 2013.
Taleie S. M. et al., "A 0.181 1/4 m CMOS fully integrated RFDAC and VGA for WCDMA transmitters", IEEE Radio Frequency Integrated Circuits Symposium (RFIC), Jun. 17, 2008, IEEE, Piscataway, NJ, USA, pp. 157-160, XP031284307, ISBN: 978-1-4244-1808-4.

* cited by examiner

*Primary Examiner* — Robert Pascal
*Assistant Examiner* — Khiem Nguyen
(74) *Attorney, Agent, or Firm* — Ramin Mobarhan

(57) ABSTRACT

A switching amplifier with an embedded harmonic rejection filter is disclosed. In an exemplary design, the switching amplifier includes a generator circuit and a plurality of output circuits. The generator circuit receives an input signal and a carrier signal at a carrier frequency and generates a plurality of versions of a drive signal associated with different delays. The drive signal may be a pulse width modulation (PWM) signal. The plurality of versions of the drive signal may be generated by delaying the carrier signal, or the input signal, or the drive signal. The output circuits receive the plurality of versions of the drive signal and provide an output signal. The output circuits have outputs that are coupled together and implement a finite impulse response (FIR) filter based on the plurality of versions of the drive signal. The FIR filter has a frequency response with zeros at harmonics of the carrier frequency.

19 Claims, 9 Drawing Sheets

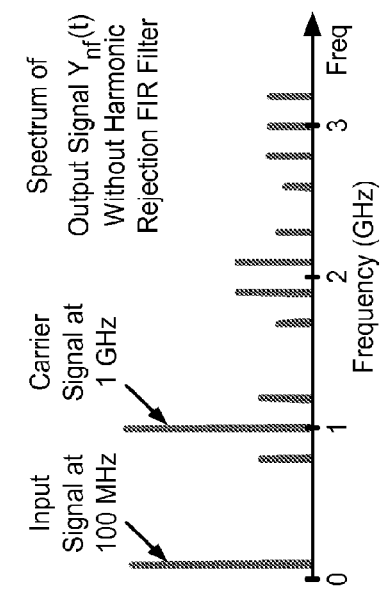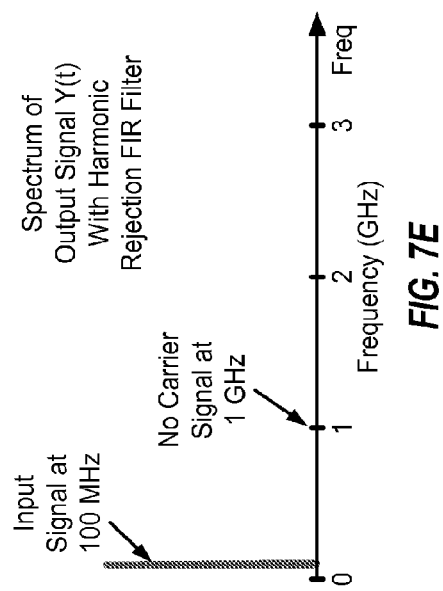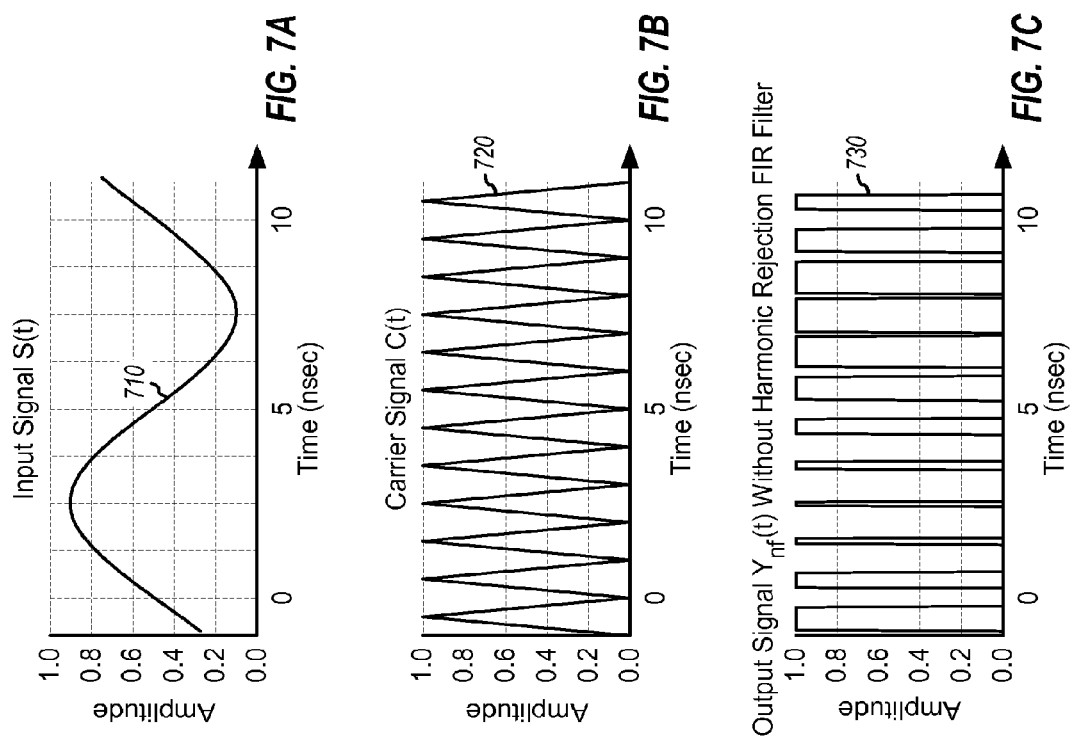

SWITCHING AMPLIFIER WITH EMBEDDED HARMONIC REJECTION FILTER

BACKGROUND

I. Field

The present disclosure relates generally to electronics circuits, and more specifically to an amplifier.

II. Background

Amplifiers are commonly used in various applications such as communication, audio, etc. Amplifiers may be categorized into different classes such as class A, class B, class AB, and class D. Class A, B and AB amplifiers are linear amplifiers that operate in linear region. Class D amplifiers are switching amplifiers that operate in triode and cut-off regions. Consequently, class D amplifiers can typically achieve much higher power efficiency than linear amplifiers.

A class D amplifier is commonly used with a modulation technique such as pulse width modulation (PWM) or pulse density modulation (PDM). A PWM modulator typically receives an analog input signal and a carrier signal and generates a PWM drive signal that controls the switching of the class D amplifier. The PWM drive signal has (i) a variable duty cycle that is determined by the amplitude of the analog input signal and (ii) a fixed switching frequency that is determined by the frequency of the carrier signal. The carrier signal may have a sawtooth waveform or a triangular waveform. An output signal from the class D amplifier typically includes strong harmonics of the carrier signal. An output filter is typically coupled to the output of the class D amplifier and used to attenuate the harmonics of the carrier signal. However, the output filter typically occupies a large circuit area in order to provide sufficient attenuation of the carrier signal harmonics.

BRIEF DESCRIPTION OF THE DRAWINGS

FIGS. 7A, 7B, 7C, 7D, 7E show various signals related to the switching amplifier in FIG. 6A.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

A switching amplifier with embedded harmonic rejection filter is disclosed herein. The switching amplifier may implement a class D amplifier and may have high efficiency but also strong carrier signal harmonics. The embedded harmonic rejection filter attenuates the carrier signal harmonics so that a relatively simple and small output filter can be used to filter an output signal from the switching amplifier. The switching amplifier may be used for various applications such as wireless communication, near field communication (NFC), frequency modulation (FM), power management integrated circuit (PMIC), audio, power amplifier, etc. The switching amplifier may also be used in various architectures including an open-loop architecture and a close-loop architecture.

Figure 1:
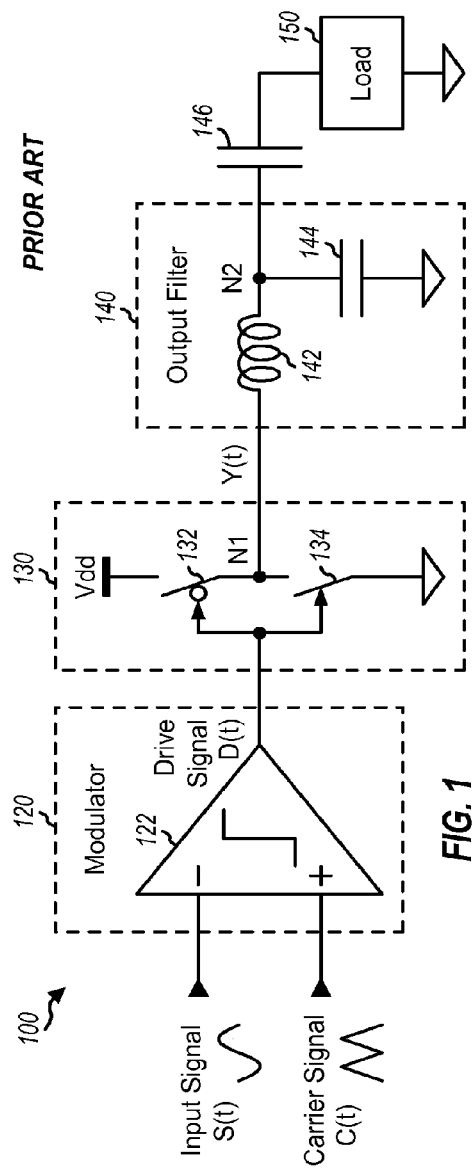
FIGS. 1 and 2 show schematic diagrams of a switching amplifier with an open-loop architecture and a switching amplifier with a close-loop architecture, respectively.

FIG. 1 shows a schematic diagram of an exemplary design of a switching amplifier 100 with an open-loop architecture. Power amplifier 100 includes a modulator 120 and an output circuit 130. In the exemplary design shown in FIG. 1, modulator 120 is implemented with a comparator 122 having its inverting input receiving an input signal S(t) and its non-inverting input receiving a carrier signal C(t). Comparator 122 compares the input signal against the carrier signal and generates a drive signal D(t) based on the results of the comparison.

The carrier signal has a fixed frequency, which is also referred to as a switching frequency. The carrier signal may have a sawtooth waveform (as shown in FIG. 1), a triangular waveform, a square waveform, etc. The drive signal has (i) a fixed switching frequency determined by the frequency of the carrier signal and (ii) a variable duty cycle determined by the amplitude of the input signal. The drive signal is digital in nature and toggles between logic high (e.g., a power supply voltage, Vdd) and logic low (e.g., circuit ground).

In the exemplary design shown in FIG. 1, output circuit 130 is implemented with two switches 132 and 134 coupled in series and between the Vdd supply and circuit ground. Switch 132 has one terminal coupled to node N1, another terminal coupled to the Vdd supply, and a control input receiving the drive signal. Switch 134 has one terminal coupled to node N1, another terminal coupled to circuit ground, and a control input receiving the drive signal. Switch 132 may be implemented with a P-channel metal oxide semiconductor (PMOS) transistor and/or a transistor of some other type. Switch 134 may be implemented with an N-channel metal oxide semiconductor (NMOS) transistor and/or a transistor of some other type. Output circuit 130 provides an output signal Y(t) at node N1.

In the exemplary design shown in FIG. 1, an output filter 140 is coupled to switching amplifier 100 and is implemented with an inductor 142 and a capacitor 144 forming a lowpass filter. Inductor 142 has one end receiving the output signal from output circuit 130 and the other end coupled to node N2. Capacitor 144 is coupled between node N2 and circuit ground. In general, output filter 140 may be implemented with any number of circuit components and may comprise a lowpass filter, a bandpass filter, a highpass filter, etc. A direct current (DC) blocking capacitor 146 is coupled between node N2 and a load 150.

Switching amplifier 100 operates as follows. Comparator 122 generates a pulse in the drive signal in each period or cycle of the carrier signal. The width of the pulse is determined by the amplitude of the input signal. The drive signal includes a stream of pulses at the carrier frequency and may be referred to as a PWM signal. When the input signal is higher than the carrier signal, the drive signal is at logic low, switch 132 is turned on, switch 134 is turned off, and the Vdd voltage is provided to the output signal from output circuit 130. Conversely, when the input signal is lower than the carrier signal, the drive signal is at logic high, switch 134 is turned on, switch 132 is turned off, and a low voltage corresponding to circuit ground is provided to the output signal from output circuit 130. Output circuit 130 either sources or sinks a current based on the drive signal.

The output signal from output circuit 130 is digital in nature and includes the desired input signal as well as undesired harmonics of the carrier signal. The carrier signal harmonics are at integer multiples of the carrier/switching frequency. Output filter 140 filters the output signal to pass the desired input signal and attenuate the undesired carrier signal harmonics as well as other extraneous high frequency components. The switching frequency may be much higher than the bandwidth of the desired input signal. In this case, output filter 140 may be implemented with a simple low-order filter, e.g., a second-order LC filter composed of inductor 142 and capacitor 144.

Figure 2:
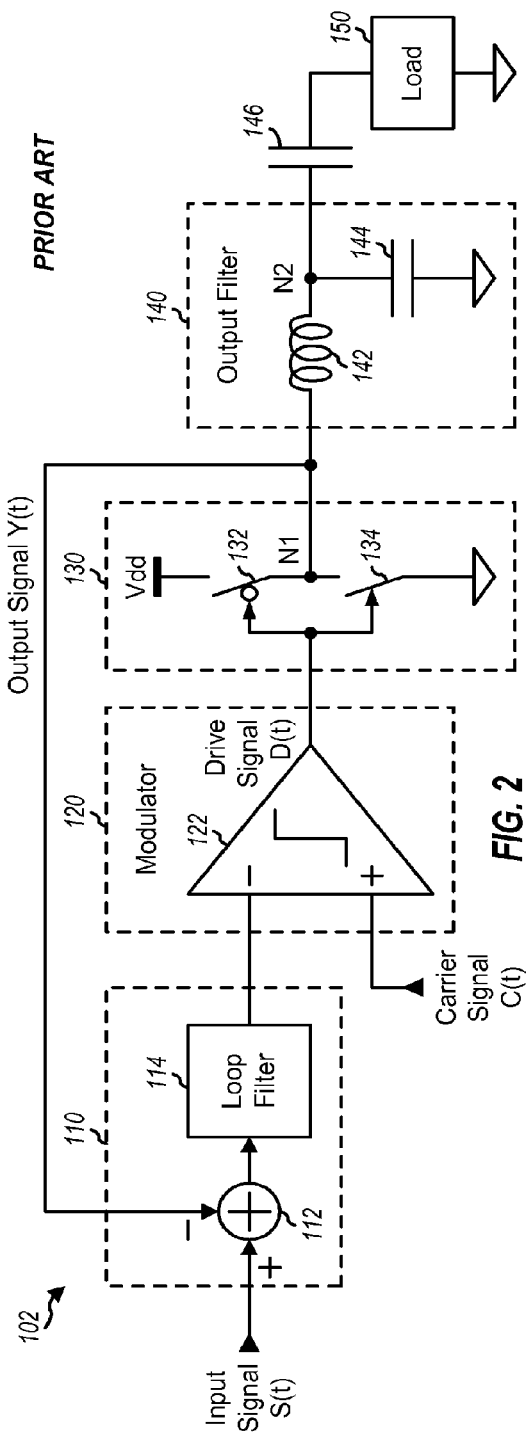

FIG. 2 shows a schematic diagram of an exemplary design of a switching amplifier 102 with a close-loop architecture. Power amplifier 102 includes modulator 120 and output circuit 130 within power amplifier 100 in FIG. 1. Power amplifier 102 further includes a feedback circuit 110.

In the exemplary design shown in FIG. 2, feedback circuit 110 includes a summer 112 and a loop filter 114. Summer 112 receives the input signal S(t) and the output signal Y(t) from output circuit 130, subtracts the output signal from the input signal, and provides an error signal. Summer 112 may be implemented with an amplifier having its inverting input receiving the output signal and its non-inverting input receiving the input signal. Loop filter 114 filters the error signal and provides a filtered error signal to the inverting input of comparator 122 within modulator 120. The use of feedback in switching amplifier 102 may improve total harmonic distortion (THD) and power supply rejection ratio (PSRR) of the output signal.

Switching amplifier 100 in FIG. 1 and switching amplifier 102 in FIG. 2 are two exemplary designs of a class D amplifier. It is well known that a class D amplifier has better performance than other classes of amplifiers.

Figure 3A:
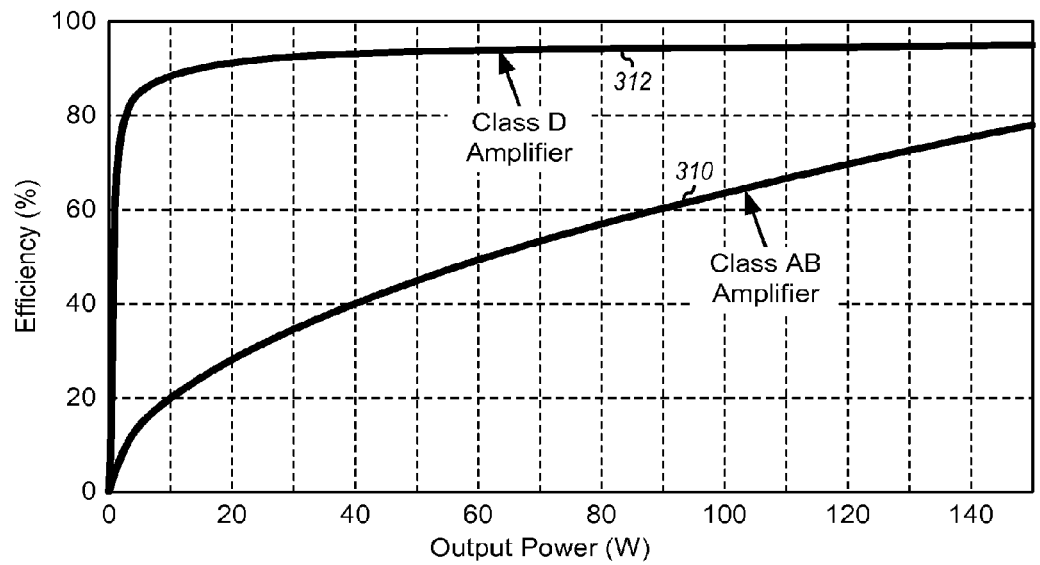
FIGS. 3A and 3B show efficiency and power dissipation, respectively, for different classes of amplifier.

FIG. 3A shows plots of efficiency versus output power for different classes of amplifier. In FIG. 3A, the horizontal axis denotes output power and is given in units of Watts (W). The vertical axis denotes efficiency and is given in units of percent (%). A plot 310 shows efficiency versus output power for a class AB amplifier. A plot 312 shows efficiency versus output power for a class D amplifier. FIG. 3A shows that a class D amplifier has much higher efficiency than a class AB amplifier. FIG. 3A also shows that a class D amplifier can achieve high efficiency over a wide range of output power levels.

Figure 3B:
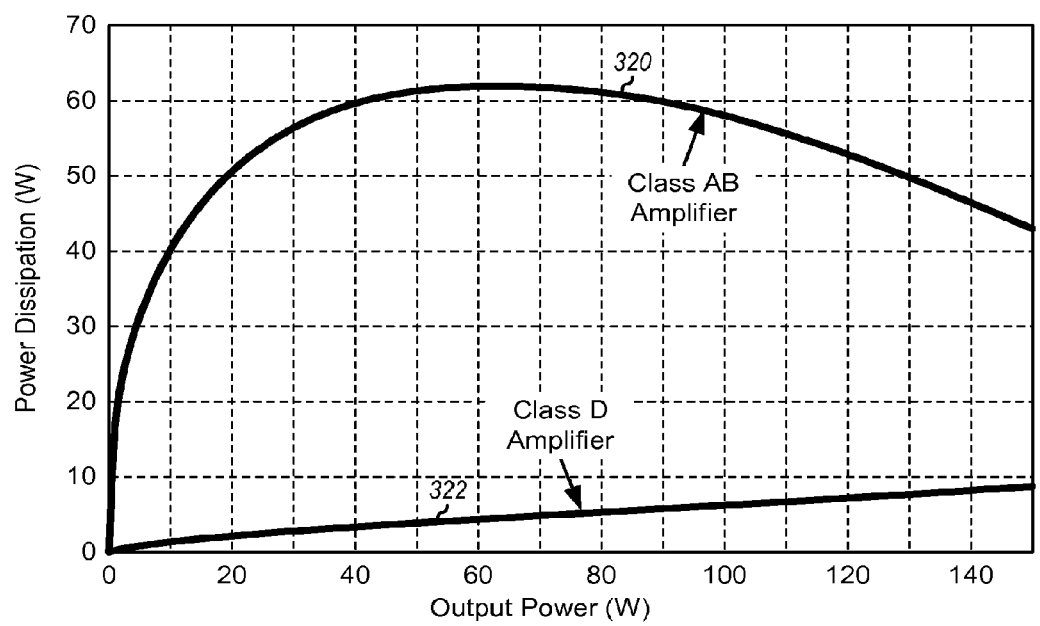

FIG. 3B shows plots of power dissipation versus output power for different classes of amplifier. In FIG. 3B, the horizontal axis denotes output power and is given in units of Watts. The vertical axis denotes power dissipation by an amplifier and is given in units of Watts. A plot 320 shows power dissipation versus output power for a class AB amplifier. A plot 322 shows power dissipation versus output power for a class D amplifier. FIG. 3B shows that a class D amplifier has much lower power dissipation than a class AB amplifier.

FIG. 3B also shows that power dissipation of a class D amplifier rises modestly over a wide range of output power levels.

As shown in FIGS. 3A and 3B, a switching amplifier implementing a class D amplifier may have better performance than other classes of amplifiers. However, an output signal from a switching amplifier includes desired input signal components as well as undesired carrier signal components. As show in FIGS. 1 and 2, output filter 140 may be used to attenuate the undesired carrier signal harmonics. Output filter 140 may include large circuit components (e.g., one or more large inductors and/or one or more large capacitors) in order to provide the desired amount of filtering of the carrier signal harmonics. For example, the input signal may have a bandwidth of 100 megahertz (MHz), and the carrier signal may have a fixed frequency of 1 gigahertz (GHz). To obtain 50 decibels (dB) of attenuation of the carrier signal at 1 GHz, output filter 140 may be implemented with inductor 142 having a value of 100 nano-Henry (nH) and capacitor 144 having a value of 80 pico-Farad (pF). Output filter 140 would then occupy a large circuit area because of the relatively large inductor and the relatively large capacitor. Furthermore, output filter 140 would have a relatively narrow bandwidth of 56 MHz, which is smaller than the 100 MHz bandwidth of the input signal. Hence, higher frequency components of the input signal would be attenuated by the relatively narrow bandwidth of output filter 140.

In an aspect of the present disclosure, a switching amplifier includes an embedded harmonic rejection filter that can attenuate harmonics of a carrier signal. Harmonic rejection is achieved by generating a plurality of drive signals with different delays, applying the drive signals to a plurality of output circuits, and summing the outputs of the output circuits to obtain a summed signal. The summed signal has a spectrum that is equal to the spectrum of one drive signal multiplied by a transfer function having zeros at the harmonic frequencies. Since the carrier signal harmonics are attenuated by the transfer function, the requirements of an output filter coupled to the switching amplifier may be relaxed. The output filter may thus be implemented with smaller circuit components and may occupy a smaller circuit area due to the relaxed requirements.

Figure 4:
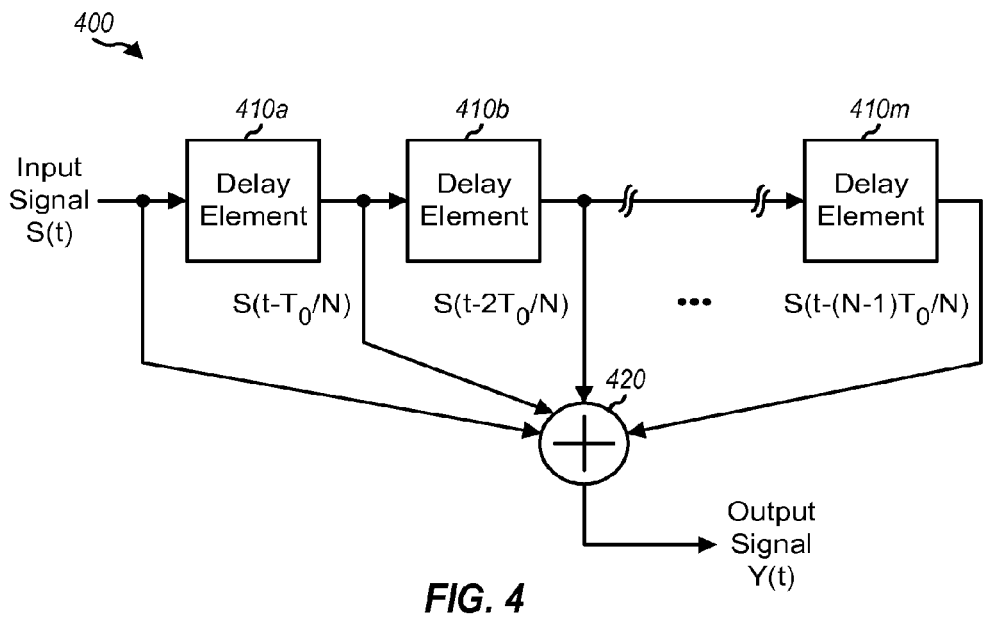
FIG. 4 shows a finite impulse response (FIR) filter for an embedded harmonic rejection filter.

FIG. 4 shows an exemplary design of a FIR filter 400 that may be used for an embedded harmonic rejection filter. FIR filter 400 includes N−1 delay elements 410a to 410m coupled in series, where N may be any integer value greater than one. Each delay element 410 provides a delay of $T_0/N$, where $T_0$ is one period of the carrier signal.

An input signal S(t) is provided to the first delay element 410a in FIR filter 400. Each delay element 410 provides a respective delayed input signal having a different delay. The input signal and the N−1 delayed input signals from the N−1 delay elements 410a to 410m form a set of N delayed signals associated with different amounts of delay. The set of N delayed signals is denoted as $S(t)$, $S(t-T_0/N)$, $S(t-2T_0/N)$, ..., $S(t-(N-1)\cdot T_0/N)$ and is summed by a summer 420 to generate an output signal Y(t), which may be expressed as:

$$Y(t) = \sum_{n=0}^{N-1} b_n \cdot S(t - n \cdot T_0/N), \quad \text{Eq (1)}$$

where $b_n$ is a coefficient for the n-th FIR filter tap. Coefficient $b_n$ is equal to 1 for FIR filter 400 in FIG. 4 but may be equal to other values to obtain a desired filter response.

The output signal in the frequency domain may be expressed as:

$$Y(\omega) = S(\omega) \cdot H(\omega), \text{ and} \qquad \text{Eq (2)}$$

$$H(\omega) = 1 + e^{-j\omega\frac{T_0}{N}} + e^{-j\omega\frac{T_0}{N}} + \ldots + e^{-j\omega\frac{(N-1)\cdot T_0}{N}}$$

$$= \left(\frac{1 - e^{-j2\pi\frac{\omega}{\omega_0}}}{1 - e^{-j2\pi\frac{\omega}{N\omega_0}}}\right) \qquad \text{Eq (3)}$$

where $S(\omega)$ denotes the input signal in the frequency domain,
$Y(\omega)$ denotes the output signal in the frequency domain,
$H(\omega)$ denotes a transfer function of FIR filter 400,
$\omega = 2\pi \cdot f$, with f denoting frequency, and
$\omega_0 = 2\pi \cdot f_0$, with $f_0$ denoting the frequency of the carrier signal.

Figure 5:
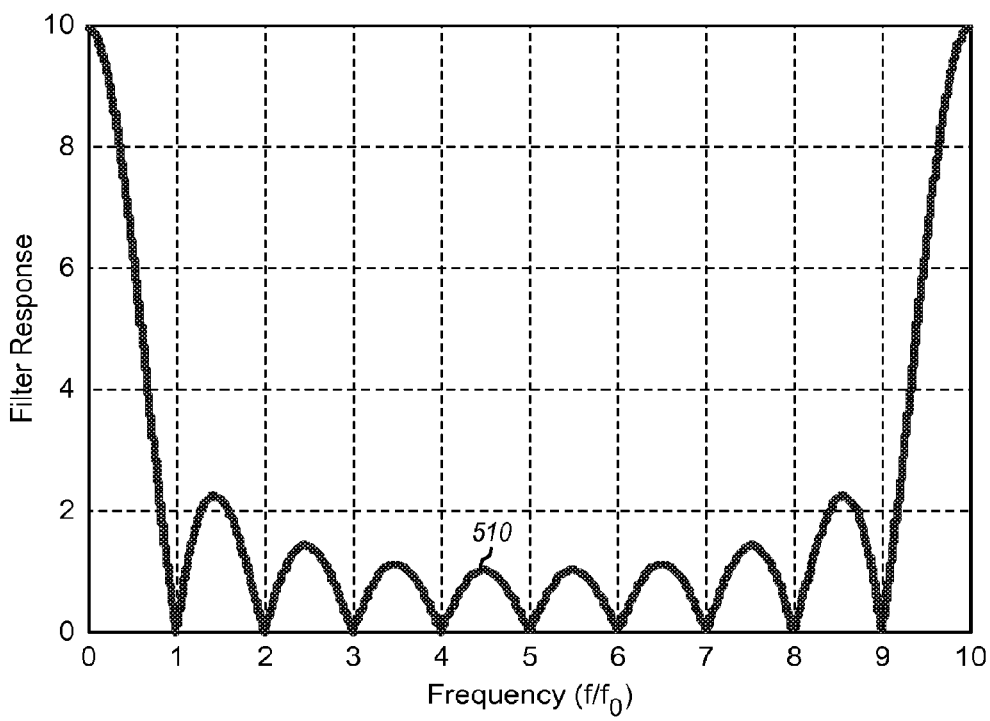
FIG. 5 shows a transfer function of the FIR filter in FIG. 4.

FIG. 5 shows a plot 510 of the transfer function $H(\omega)$ of FIR filter 400 in FIG. 4. The horizontal axis denotes frequency and is given in units of $f/f_0$. The vertical axis denotes amplitude and is given in linear unit. FIG. 5 shows an example with N=10. As shown in FIG. 5, the transfer function $H(\omega)$ of FIR filter 400 has a value of zero for $\omega = k \cdot \omega_0$, where k=1, 2, ..., N-1. This means that the output signal $Y(k \cdot \omega_0)$ is equal to zero at all harmonics of the carrier frequency $\omega_0$.

A switching amplifier may include an embedded FIR filter to attenuate harmonics of a carrier signal, including the fundamental harmonic at $\omega_0$. The FIR filter may also reduce noise folding, which may improve performance. The switching amplifier may be implemented in various manners, and some exemplary designs are described below.

Figure 6A:
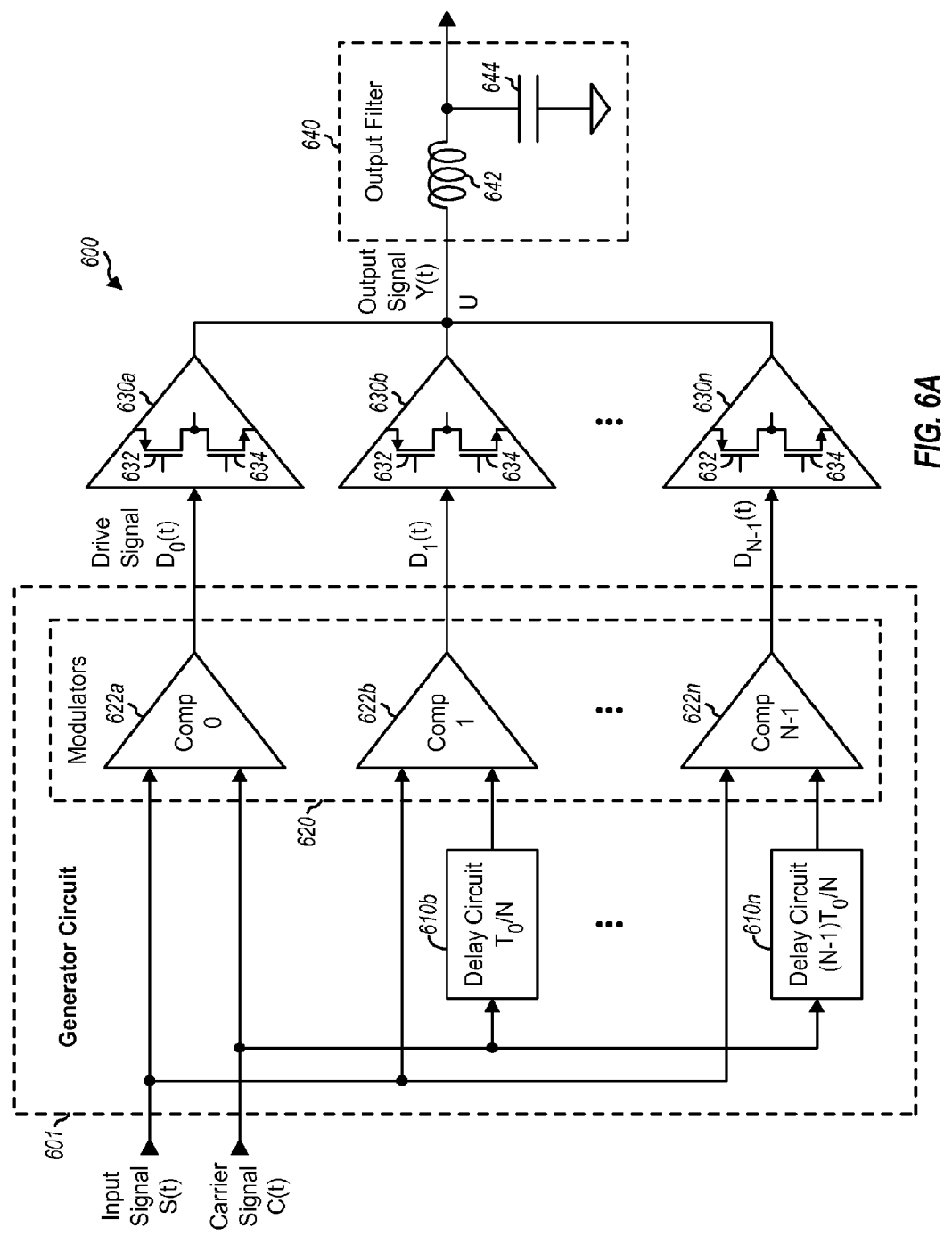
FIGS. 6A, 6B, 6C show three exemplary designs of a switching amplifier with an embedded harmonic rejection filter.

FIG. 6A shows a schematic diagram of an exemplary design of a switching amplifier 600 with an embedded harmonic rejection filter. Switching amplifier 600 implements a FIR filter for harmonic rejection by delaying a carrier signal by different amounts. Switching amplifier 600 includes a generator circuit 601 and N output circuits 630a to 630n. Generator circuit 601 includes N−1 delay circuits 610b to 610n and N modulators 620 comprising N comparators (Comp) 622a to 622n. A carrier signal C(t) is provided to each of the N−1 delay circuits 610b to 610n, which provide different delays of $T_0/N$ to $(N-1) \cdot T_0/N$, respectively. The n-th delay circuit 610 provides the n-th delayed carrier signal $C_n(t) = C(t - n \cdot T_0/N)$, for n=1, 2, ..., N−1.

Comparator 622a receives the carrier signal at one input and an input signal S(t) at another input and provides a first drive signal $D_0(t)$. Comparator 622b receives the delayed carrier signal from delay circuit 610b at one input and the input signal at another input and provides a second drive signal $D_1(t)$, which is a delayed version of the first drive signal, or $D_1(t) = D_0(t - T_0/N)$. Each remaining comparator 622 receives the delayed carrier signal from a corresponding delay circuit 610 at one input and the input signal at another input and provides a corresponding drive signal. The n-th comparator 622 provides the n-th drive signal $D_n(t) = D_0(t - n \cdot T_0/N)$, for n=0, 1, 2, ..., N−1.

Output circuits 630a to 630n receive drive signals from comparators 622a to 622n, respectively. Each output circuit 630i, for i=a, b, ..., n, is controlled by a respective drive signal to couple its output to either the Vdd supply or circuit ground. Each output circuit 630i may be implemented with a PMOS transistor 632 and an NMOS transistor 634. PMOS transistor 632 has its source coupled to the Vdd supply and its drain coupled to the output of output circuit 630i. NMOS transistor 634 has its source coupled to circuit ground and its drain coupled to the output of output circuit 630i. Control signals for the gates of PMOS transistor 632 and NMOS transistor 634 may be generated based on the drive signal for output circuit 630i. The outputs of all N output circuits 630a to 630n are coupled together at node U and summed.

In one exemplary design, each output circuit 630 may be implemented with push-pull transistors, as shown in FIG. 6A. In another exemplary design, an output circuit may be implemented with a digital-to-analog converter (DAC). An output circuit may also be implemented with other circuits.

The output signal Y(t) at node U may be expressed as shown in equation (1). In general, the N output circuits 630a to 630n may have the same gain or different gains. The frequency response shown in FIG. 5 may be obtained with the same gain for the N output circuits 630a to 630n, or $b_n = 1$ for n=0, 1, 2, ..., N−1 in equation (1). A desired frequency response (e.g., for a lowpass filter, a bandpass filter, or a highpass filter) may be obtained with non-uniform gains for the N output circuits 630a to 630n. Different gains for different output circuits may be obtained in various manners. In one exemplary design, a higher gain may be obtained for a given output circuit 630 by using more NMOS transistors and/or more PMOS transistors coupled in parallel to provide more current drive. In another exemplary design, a higher gain may be obtained for a given output circuit 630 by using a larger NMOS transistor and/or a larger PMOS transistor. In yet another exemplary design, a higher gain may be obtained for a given output circuit 630 by using a higher supply voltage.

In the exemplary design shown in FIG. 6A, an output filter 640 is coupled to switching amplifier 600 and is implemented with an inductor 642 and a capacitor 644 forming a lowpass filter. Inductor 642 and capacitor 644 are coupled in similar manner as inductor 142 and capacitor 144 within output filter 140 in FIG. 1. Output filter 640 may be implemented with a smaller inductor and/or a smaller capacitor due to relaxed filtering requirements resulting from attenuation of the carrier signal harmonics by the embedded harmonic rejection filter in switching amplifier 600. In the example described above with an input signal bandwidth of 100 MHz and a carrier frequency of 1 GHz, output filter 640 can provide 50 dB rejection of carrier signal harmonics with inductor 642 having a value of 5 nH and capacitor 644 having a value of 1 pF. In contrast, without an embedded harmonic rejection filter, output filter 140 in FIG. 1 can provide 50 dB rejection of carrier signal harmonics with inductor 142 having a much larger value of 100 nH and capacitor 144 having a much larger value of 80 pF. Output filter 640 may thus occupy a much smaller circuit area than output filter 140.

Switching amplifier 600 may be operated in an open-loop manner, as shown in FIG. 6A. Switching amplifier 600 may also be operated in a close-loop manner by including a feedback circuit having a summer and a loop filter, e.g., as shown in FIG. 2. In this case, the input signal and the output signal may be provided to the summer, which may provide an error signal to the loop filter. A filtered error signal (instead of the input signal) may be provided by the loop filter to the N comparators 622a to 622n.

Switching amplifier 600 in FIG. 6A has several novel features. First, multiple stages of modulator 620 and output circuit 630 are coupled in parallel, and the outputs of all output circuits 630 are coupled together at a summing node U. Second, carrier signals provided to the N modulators 620 are progressively delayed. Third, a single output filter 640 is used for the summed output of all N output circuits 630a to 630n.

FIGS. 7A to 7E show various signals related to switching amplifier 600 in FIG. 6A. FIG. 7A shows a plot 710 of the input signal S(t) provided to switching amplifier 600. In this example, the input signal comprises a sinusoidal at a frequency of 100 MHz. FIG. 7B shows a plot 720 of the carrier signal C(t) provided to switching amplifier 600. In this example, the carrier signal is a sawtooth signal at a frequency of 1 GHz. FIG. 7C shows a plot 730 of an output signal $Y_{nf}(t)$ provided by an output circuit in a switching amplifier without an embedded harmonic rejection filter. This output signal $Y_{nf}(t)$ may be equal to the output signal $Y_0(t)$ from output circuit 630a in FIG. 6A, assuming that it is not connected to the remaining N−1 output circuits 630b to 630n. The output signal $Y_{nf}(t)$ has a frequency of 1 GHz and a duty cycle that is dependent on the amplitude of the input signal.

FIG. 7D shows a plot of the frequency response of the output signal $Y_{nf}(t)$ in FIG. 7C. As shown in FIG. 7D, the output signal $Y_{nf}(t)$ includes the desired input signal at 100 MHz as well as the undesired carrier signal at 1 GHz and other undesired signal components. FIG. 7E shows a plot of the frequency response of the output signal Y(t) with an embedded harmonic rejection filter from the combined outputs of the N output circuits 630a to 630n in FIG. 6A. As shown in FIG. 7E, the output signal Y(t) includes the desired input signal at 100 MHz but no or minimal undesired carrier signal harmonics. FIGS. 7D and 7E show the effectiveness of the embedded harmonic rejection filter in attenuating undesired carrier signal harmonics. FIG. 7E shows the embedded harmonic rejection filter attenuating all harmonics of the carrier signal, including the fundamental harmonic at 1 GHz. The harmonic rejection technique disclosed herein is different from a harmonic rejection mixer technique that attempts to preserve the signal component at $\omega_0$ but attempts to filter out the remaining harmonics $\omega = k \cdot \omega_0$, for $k \geq 2$.

Figure 6B:
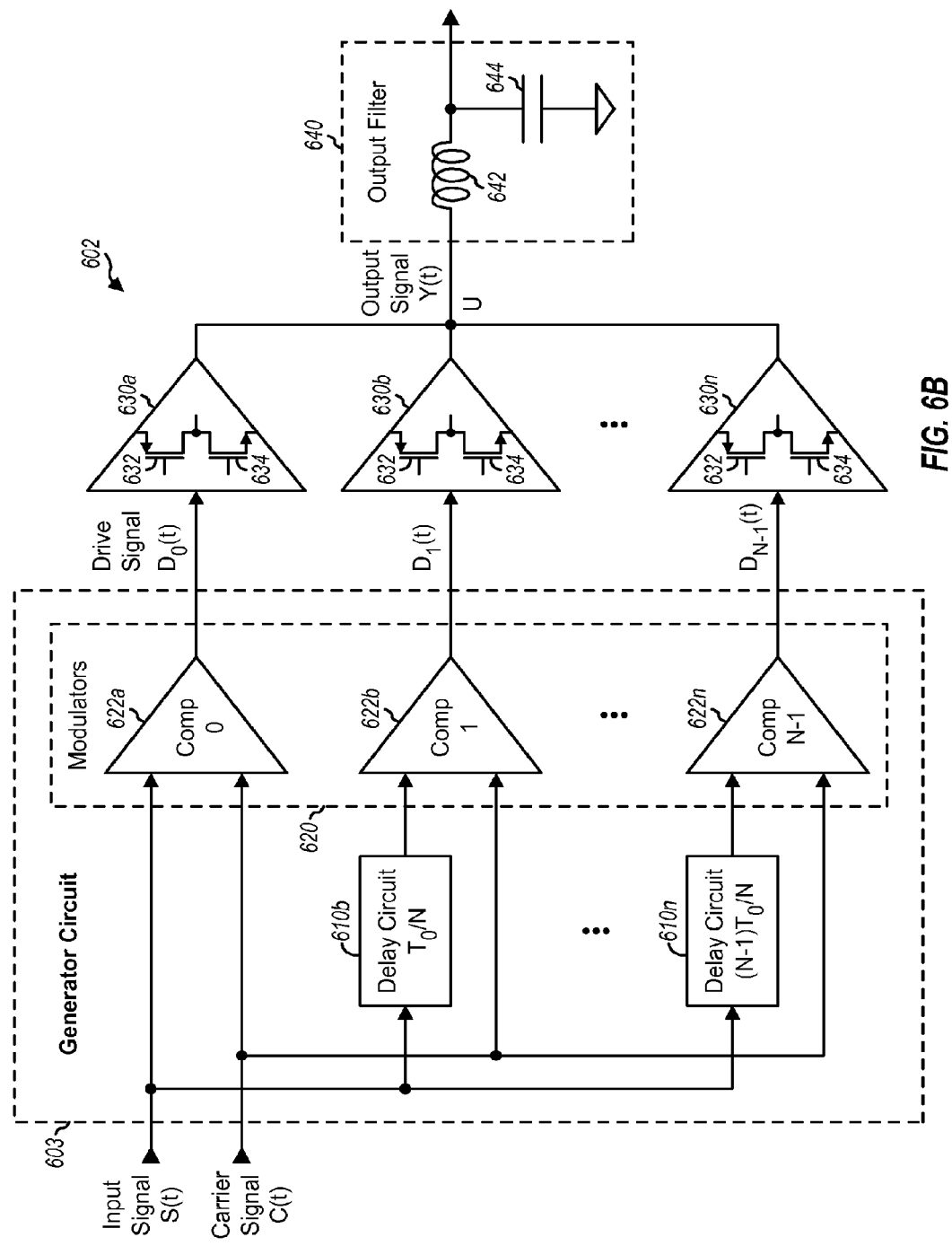

FIG. 6B shows a schematic diagram of an exemplary design of a switching amplifier 602 with an embedded harmonic rejection filter. Switching amplifier 602 implements a FIR filter for harmonic rejection by delaying an input signal by different amounts. Switching amplifier 602 includes a generator circuit 603 and N output circuits 630a to 630n. Generator circuit 603 includes N−1 delay circuits 610b to 610n and N modulators 620 comprising N comparators 622a to 622n. An input signal S(t) is provide to each of the N−1 delay circuits 610b to 610n, which provide different delays of $T_0/N$ to $(N-1) \cdot T_0/N$, respectively. The n-th delay circuit 610 provides the n-th delayed input signal. The N comparators 622a to 622n receive the same carrier signal C(t) as well as N input signals $S_0(t)$ to $S_{N-1}(t)$, respectively, associated with different amounts of delay. Each comparator 622 generates a respective drive signal based on its delayed input signal and the carrier signal. The N comparators 622a to 622n provide N drives signals $D_0(t)$ to $D_{N-1}(t)$, respectively.

Figure 6C:
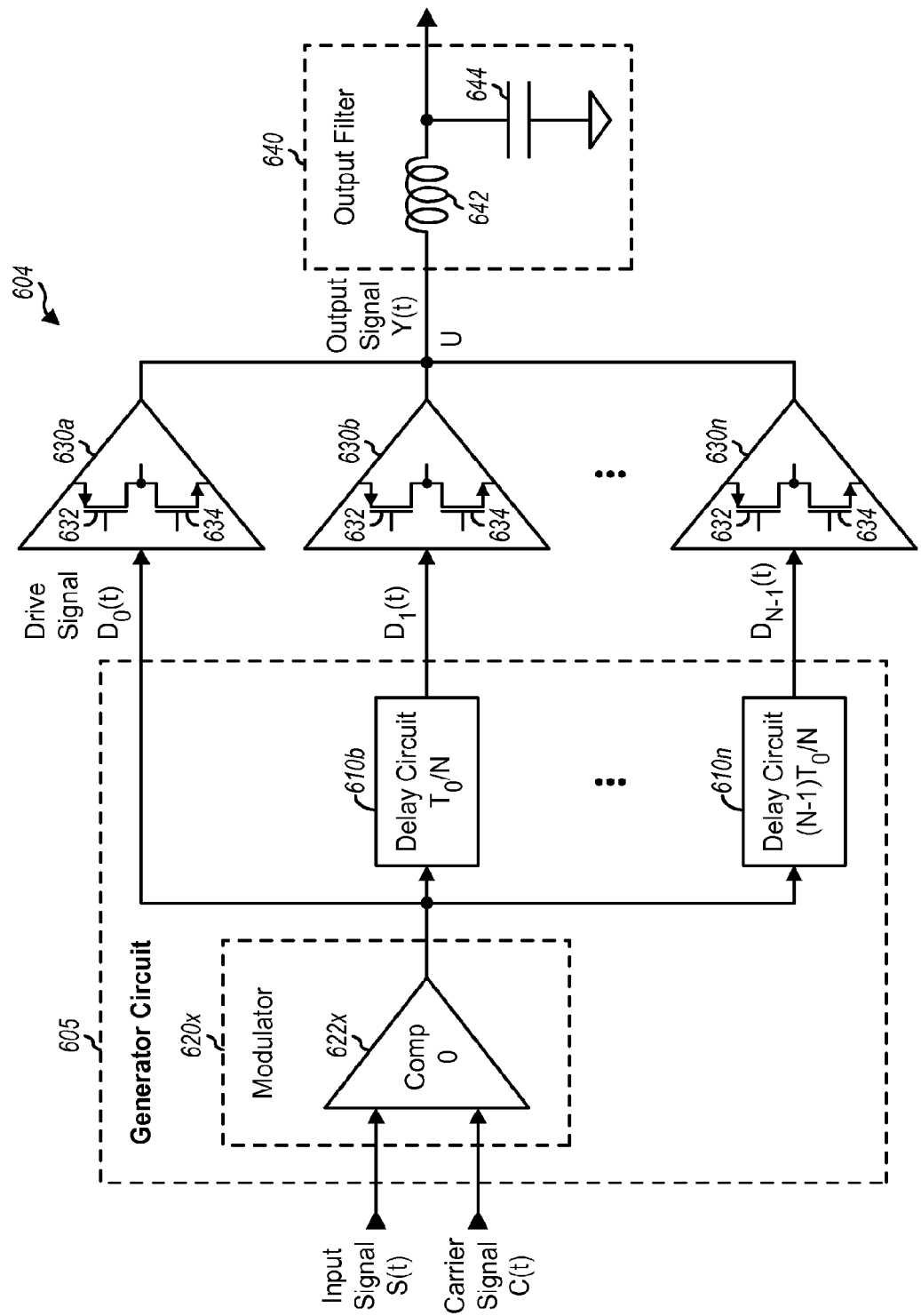

FIG. 6C shows a schematic diagram of an exemplary design of a switching amplifier 604 with an embedded harmonic rejection filter. Switching amplifier 604 implements a FIR filter for harmonic rejection by delaying a drive signal by different amounts. Switching amplifier 604 includes a generator circuit 605 and N output circuits 630a to 630n. Generator circuit 605 includes N−1 delay circuits 610b to 610n and a single modulator 620x comprising a comparator 622x. Comparator 622x receives an input signal S(t) and a carrier signal C(t) and provides a drive signal D(t). The drive signal is provided to output circuit 630a and also to each of the N−1 delay circuits 610b to 610n. Delay circuits 610b to 610n provide different delays of $T_0/N$ to $(N-1) \cdot T_0/N$, respectively. The n-th delay circuit 610 provides the n-th delayed drive signal. Each output circuit 630 receives a respective drive signal and is controlled by its drive signal.

Switching amplifier 602 in FIG. 6B and switching amplifier 604 in FIG. 6C are functionally equivalent to switching amplifier 600 in FIG. 6A. N drive signals $D_0(t)$ to $D_{N-1}(t)$ associated with different amounts of delay may be obtained by delaying the carrier signal (e.g., as shown in FIG. 6A), or delaying the input signal (e.g., as shown in FIG. 6B), or delaying the drive signal (e.g., as shown in FIG. 6C).

FIGS. 6A to 6C show three exemplary designs of a switching amplifier with an embedded harmonic rejection filter. In another exemplary design, a switching amplifier with an embedded harmonic rejection filter may include a generator circuit comprising a phase locked loop (PLL) instead of comparator 622x in FIG. 6C. The PLL may receive an input signal S(t) and a reference clock and may provide a drive signal D(t). The PLL may perform direct FM. A switching amplifier with an embedded harmonic rejection filter may also be implemented in other manners.

A switching amplifier with an embedded harmonic rejection filter may be implemented with a single-ended design, e.g., as shown in FIGS. 6A to 6C. A switching amplifier with an embedded harmonic rejection filter may also be implemented with a differential design. For example, the circuits in FIG. 6A may be replicated. A non-inverted input signal S(t) and a non-inverted carrier C(t) may be provided to a first copy of the circuits to generate a non-inverted output signal Y(t). An inverted input signal $\overline{S}(t)$ and an inverted carrier $\overline{C}(t)$ may be provided to a second copy of the circuits to generate an inverted output signal $\overline{Y}(t)$. The inverted and non-inverted output signals may be provided to one or more output filters.

In an exemplary design, multiple switching amplifiers, each with an embedded harmonic rejection filter, may be coupled in cascade/series in order to improve attenuation of undesired out-of-band signal components. In general, any number of switching amplifiers with embedded harmonic rejection filter may be coupled in cascade. The switching amplifiers may be identical or have different designs.

Figure 8:
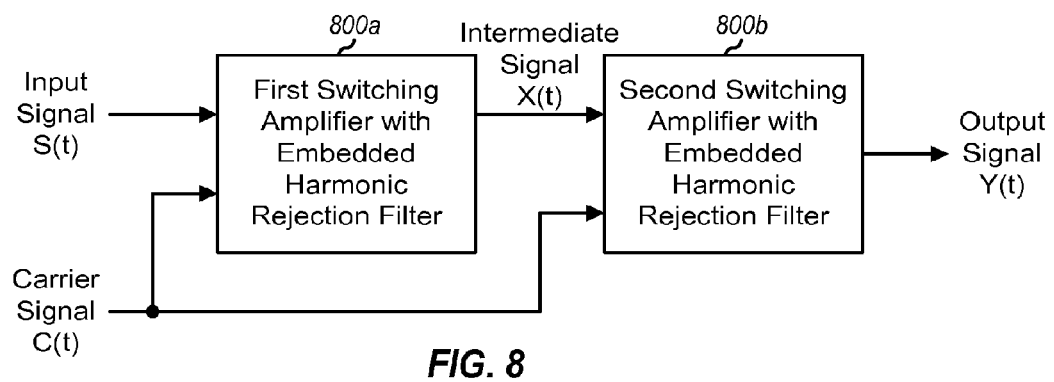
FIG. 8 shows a block diagram of two switching amplifiers coupled in cascade.

FIG. 8 shows a block diagram of an exemplary design of two switching amplifiers 800a and 800b coupled in cascade, with each switching amplifier 800 having an embedded harmonic rejection filter. Switching amplifier 800a receives an input signal S(t) and a carrier signal C(t) and provides an intermediate signal X(t). Switching amplifiers 800b receives the intermediate signal X(t) and the carrier signal C(t) and provides an output signal Y(t). An output filter (not shown in FIG. 8) may receive and filter the output signal Y(t).

Switching amplifiers 800a and 800b may each be implemented with switching amplifier 600 in FIG. 6A, switching amplifier 602 in FIG. 6B, switching amplifier 604 in FIG. 6C, or a switching amplifier of some other design. Switching amplifiers 800a and 800b may have the same number of stages/taps or different numbers of stages. Switching amplifiers 800a and 800b may receive the same carrier signal (e.g., as shown in FIG. 8) or may receive different carrier signals. For example, switching amplifier 800a may receive a first carrier signal at a first frequency, and switching amplifier 800b may receive a second carrier signal at a second frequency. The first and second frequencies may be related by an integer ratio.

Figure 9:
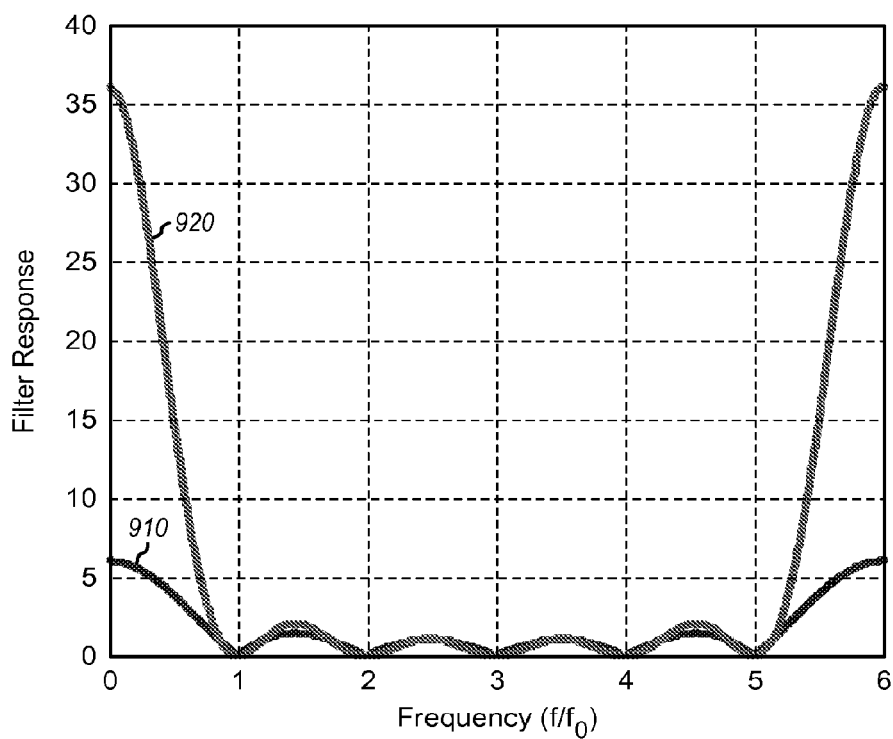
FIG. 9 shows a frequency response of the switching amplifiers in FIG. 8.

FIG. 9 shows plots of the frequency response of switching amplifiers 800a and 800b in FIG. 8. The horizontal axis denotes frequency and is given in units of $f/f_0$. The vertical axis denotes amplitude and is given in linear unit. A plot 910 shows the frequency response of a single switching amplifier 800a or 800b for a case in which N=6. A plot 920 shows the overall frequency response of both switching amplifiers 800a and 800b for the case in which N=6. As shown in FIG. 9, cascading multiple switching amplifiers may further attenuate the carrier signal harmonics at $f_0$, $2f_0$, $3f_0$, etc.

A plurality of delay circuits 610b to 610n may be used to provide different amounts of delay and may be implemented in various manners. The delay circuits may be implemented with analog circuits, or digital circuits, or a combination of both.

Figure 10:
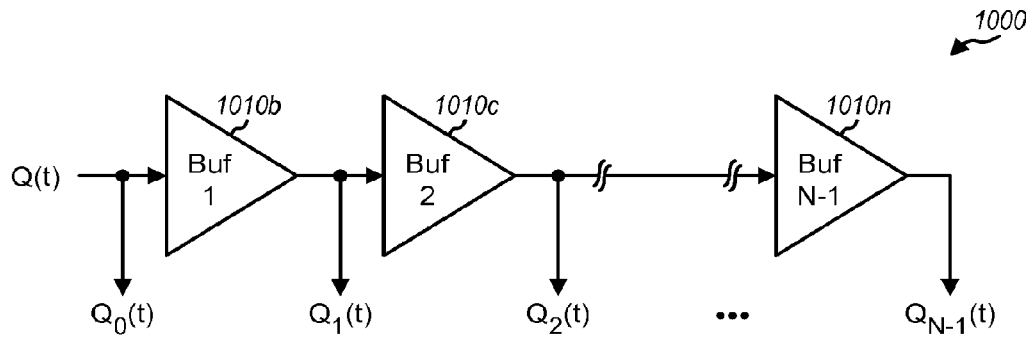
FIG. 10 shows a schematic diagram of a delay circuit block.

FIG. 10 shows a schematic diagram of an exemplary design of a delay circuit block 1000, which may be used to implement delay circuits 610b to 610n in FIGS. 6A to 6C. In the exemplary design shown in FIG. 10, delay circuit block 1000 includes N−1 buffers (Buf) 1010b to 1010n coupled in cascade/series. Each buffer 1010 provides a delay of $T_0/N$. An incoming signal Q(t) is provided to the input of the first buffer 1010b. Each buffer provides a respective delayed signal to the input of a subsequent buffer. The N−1 buffers 1010b to 1010n provide N−1 delayed signals $Q_1(t)$ to $Q_{N-1}(t)$, where $Q_0(t)$= Q(t) and $Q_i(t)=Q_{i-1}(t-T_0/N)$, for i=1, 2, . . . , N−1.

In one exemplary design, buffers 1010b to 1010n may each provide a fixed delay. In another exemplary design, buffers 1010b to 1010n may each provide a configurable delay. For example, each buffer 1010 may be implemented with multiple MOS transistors coupled in parallel. More MOS transistors may be turned on to obtain a shorter delay, and vice versa. As another example, each buffer 1010 may include a bank of capacitors. Fewer capacitors may be selected to obtain a shorter delay, and vice versa. In any case, the N−1 buffers may be configured to provide the desired amount of delay. The N−1 buffers 1010b to 1010n may be implemented (e.g., on chip) such that they match one another as closely as possible in order to obtain matching delays for all buffers.

In another exemplary design, different versions of a given signal with different delays may be obtained by digitally synthesizing these different versions of the signal. For example, the different versions of the signal may be synthesized from a look-up table based on direct digital synthesis (DDS) techniques known by those skilled in the art.

In an exemplary design, the comparators and output circuits in a switching amplifier with an embedded harmonic rejection filter may be implemented with suitable circuit components (e.g., MOS transistors). In another exemplary design, a plurality of drive signals for a plurality of output circuits may be generated in the digital domain (instead of by comparators using a carrier signal). In this exemplary design, a FIR filter may be built into a digital circuit that receives a 1-bit wide input signal and generate an N-bit wide thermometer-coded output signal. The switching amplifier may then be implemented with the digital circuit and a DAC driving an output filter.

A switching amplifier with an embedded harmonic rejection filter may provide various advantages over an amplifier without an embedded harmonic rejection filter. The switching amplifier includes multiple stages of output circuits coupled in parallel with time delay to perform filtering of undesired signal components. As a result, an output filter of a much smaller size (e.g., smaller inductor and/or smaller capacitor) can provide the required attenuation of the desired signal components after the output circuits. The smaller output filter may be implemented on-chip with the output circuits. Full integration of the output filter and output circuits may reduce complexity and cost, improve performance, and/or provide other benefits.

In an exemplary design, an apparatus (e.g., a wireless device, an integrated circuit (IC), a circuit module, etc.) may include a generator circuit and a plurality of output circuits, which may implement a switching amplifier with an embedded harmonic rejection filter. The generator circuit may receive an input signal and a carrier signal and may generate a plurality of versions of a drive signal associated with different delays. The plurality of output circuits may receive the plurality of versions of the drive signal and may provide an output signal. The plurality of output circuits may have their outputs coupled together and may implement a FIR filter based on the plurality of versions of the drive signal.

The plurality of versions of the drive signal may be generated based on the carrier signal at a carrier frequency. The FIR filter may have a frequency response with zeros at harmonics of the carrier frequency (e.g., as shown in FIGS. 5 and 9). The carrier signal may have a triangular waveform (e.g., as shown in FIG. 7B), a sawtooth waveform, a square waveform, or some other waveform. The drive signal may comprise a PWM signal or some other modulated signal.

In one exemplary design, the plurality of versions of the drive signal may be generated by delaying the carrier signal, e.g., as shown in FIG. 6A. In this exemplary design, the generator circuit may comprise at least one delay circuit and a plurality of modulators. The at least one delay circuit may receive the carrier signal and provide at least one of a plurality of versions of the carrier signal associated with different delays. The plurality of modulators may receive the plurality of versions of the carrier signal as well as the input signal (which is applied to all modulators) and may provide the plurality of versions of the drive signal.

In another exemplary design, the plurality of versions of the drive signal may be generated by delaying the input signal, e.g., as shown in FIG. 6B. In this exemplary design, the generator circuit may comprise at least one delay circuit and a plurality of modulators. The at least one delay circuit may receive the input signal and provide at least one of a plurality of versions of the input signal associated with different delays. The plurality of modulators may receive the plurality of versions of the input signal as well as the carrier signal (which is applied to all modulators) and may provide the plurality of versions of the drive signal.

In yet another exemplary design, the plurality of versions of the drive signal may be generated by delaying the drive signal, e.g., as shown in FIG. 6C. In this exemplary design, the generator circuit may comprise at least one delay circuit and a modulator. The modulator may receive the input signal and the carrier signal and may provide the drive signal. The at least one delay circuit may receive the drive signal and provide at least one of the plurality of versions of the drive signal. The plurality of versions of the drive signal may also be generated in other manners. The generator circuit may comprise digital circuitry and/or analog circuitry that can generate the plurality of versions of the drive signal based on one or more suitable signals.

In an exemplary design, each output circuit may include first and second transistors, e.g., as shown in FIGS. 6A to 6C. The first transistor (e.g., PMOS transistor 632) may be coupled between a supply voltage and an output of the output circuit. The second transistor (e.g., NMOS transistor 634) may be coupled between circuit ground and the output of the output circuit. In an exemplary design, the plurality of output circuits may have equal gain, and the FIR filter may have a frequency response shown in FIG. 5. In another exemplary design, the plurality of output circuits may have at least two different gains. The FIR filter may have a suitable frequency response determined based on the gain of each output circuit.

In an exemplary design, an output filter may be coupled to the combined outputs of the plurality of output circuits. The output filter may be of any filter type (e.g., lowpass, bandpass, or highpass) and may have any order. In an exemplary design, the at least one modulator, the plurality of output circuits, and the output filter may be implemented on the same IC chip. Alternatively, the at least one modulator and the plurality of output circuits may be implemented on an IC chip, and the output filter may be implemented external to the IC chip.

In an exemplary design, the plurality of output circuits are used in an open-loop architecture, e.g., as shown in FIG. 1. In this case, the output signal is not used to generate the plurality of versions of the drive signal. In another exemplary design, the plurality of output circuits are used in a closed-loop architecture, e.g., as shown in FIG. 2. In this case, the output signal may be fed back and used to generate the plurality of versions of the drive signal.

Figure 11:
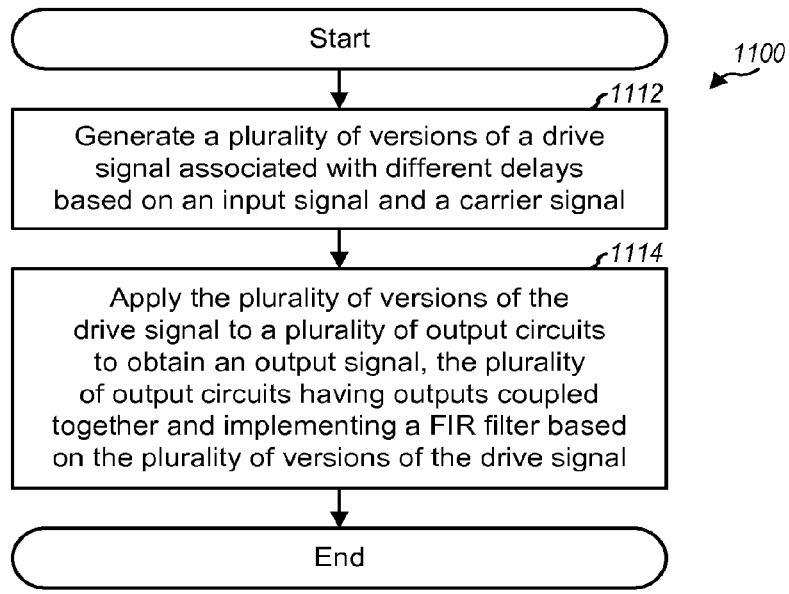
FIG. 11 shows a process for generating an output signal.

FIG. 11 shows an exemplary design of a process 1100 for generating an output signal based on a switching amplifier with an embedded harmonic rejection filter. A plurality of versions of a drive signal associated with different delays may be generated based on an input signal and a carrier signal (block 1112). The drive signal may comprise a PWM signal. The plurality of versions of the drive signal may be applied to a plurality of output circuits to obtain an output signal (block 1114). The plurality of output circuits may have outputs that are coupled together and may implement a FIR filter based on the plurality of versions of the drive signal.

In an exemplary design of block 1112, a plurality of versions of the carrier signal associated with different delays may be generated, e.g., as shown in FIG. 6A. The plurality of versions of the drive signal may then be generated based on the plurality of versions of the carrier signal and the input signal. In another exemplary design of block 1112, a plurality of versions of the input signal associated with different delays may be generated, e.g., as shown in FIG. 6B. The plurality of versions of the drive signal may be generated based on the plurality of versions of the input signal and the carrier signal. In yet another exemplary design of block 1112, the drive signal may be generated based on the input signal and the carrier signal, e.g., as shown in FIG. 6C. The plurality of versions of the drive signal may be generated by delaying the drive signal by different amounts.

A switching amplifier with an embedded harmonic rejection filter described herein may be implemented on an IC, an analog IC, a radio frequency IC (RFIC), a mixed-signal IC, an application specific integrated circuit (ASIC), a printed circuit board (PCB), an electronic device, etc. The switching amplifier may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc.

An apparatus implementing a switching amplifier with an embedded harmonic rejection filter described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a generator circuit configured to generate a plurality of versions of a drive signal associated with different delays based on a comparison of both an input signal and a carrier signal; and
   a plurality of output circuits configured to receive the plurality of versions of the drive signal associated with different delays and to provide an output signal, the plurality of output circuits having outputs coupled together and implementing a finite impulse response (FIR) filter based on the plurality of versions of the drive signal.

2. The apparatus of claim 1, the plurality of versions of the drive signal are generated based on a carrier signal at a carrier frequency, and the FIR filter has a frequency response with zeros at harmonics of the carrier frequency.

3. The apparatus of claim 1, the generator circuit comprising:
   a plurality of modulators configured to receive a plurality of versions of the carrier signal associated with different delays and the input signal applied to all modulators and to provide the plurality of versions of the drive signal.

4. The apparatus of claim 3, the generator circuit further comprising:
   at least one delay circuit configured to receive the carrier signal and provide at least one of the plurality of versions of the carrier signal.

5. The apparatus of claim 1, the generator circuit comprising:
   a plurality of modulators configured to receive a plurality of versions of the input signal associated with different delays and the carrier signal applied to all modulators and to provide the plurality of versions of the drive signal.

6. The apparatus of claim 5, the generator circuit further comprising:

at least one delay circuit configured to receive the input signal and provide at least one of the plurality of versions of the input signal.

7. The apparatus of claim 1, the generator circuit comprising:
a modulator configured to receive the input signal and the carrier signal and to provide the drive signal; and
at least one delay circuit configured to receive the drive signal and provide at least one of the plurality of versions of the drive signal.

8. The apparatus of claim 1, wherein the drive signal comprises a pulse width modulation (PWM) signal.

9. The apparatus of claim 1, each output circuit among the plurality of output circuits comprising:
a first transistor coupled between a supply voltage and an output of the output circuit; and
a second transistor coupled between circuit ground and the output of the output circuit.

10. The apparatus of claim 1, the plurality of output circuits having equal gain.

11. The apparatus of claim 1, the plurality of output circuits having at least two different gains.

12. The apparatus of claim 1, further comprising:
an output filter coupled to the outputs of the plurality of output circuits.

13. The apparatus of claim 12, wherein the plurality of output circuits and the output filter are implemented on an integrated circuit (IC) chip.

14. The apparatus of claim 1, wherein the plurality of output circuits are used in an open-loop architecture and the output signal is not used to generate the plurality of versions of the drive signal.

15. A method comprising:
generating a plurality of versions of a drive signal associated with different delays based on a comparison of both an input signal and a carrier signal; and
applying the plurality of versions of the drive signal to a plurality of output circuits to obtain an output signal, the plurality of output circuits having outputs coupled together and implementing a finite impulse response (FIR) filter based on the plurality of versions of the drive signal.

16. The method of claim 15, the generating the plurality of versions of the drive signal comprising:
generating a plurality of versions of the carrier signal or a plurality of versions of the input signal associated with different delays; and
generating the plurality of versions of the drive signal based on the plurality of versions of the carrier signal or the plurality of versions of the input signal.

17. The method of claim 15, the generating the plurality of versions of the drive signal comprising:
generating the drive signal based on the input signal and the carrier signal; and
generating the plurality of versions of the drive signal by delaying the drive signal by different amounts.

18. An apparatus comprising:
means for generating a plurality of versions of a drive signal associated with different delays based on a comparison of both an input signal and a carrier signal; and
means for generating an output signal based on the plurality of versions of the drive signal, the means for generating the output signal implementing a finite impulse response (FIR) filter based on the plurality of versions of the drive signal.

19. The apparatus of claim 18, the means for generating the plurality of versions of the drive signal comprising:
means for generating a plurality of versions of the carrier signal or a plurality of versions of the input signal associated with different delays; and
means for generating the plurality of versions of the drive signal based on the plurality of versions of the carrier signal or the plurality of versions of the input signal.

* * * * *